(12) United States Patent
Kang et al.

(10) Patent No.: US 9,193,900 B2
(45) Date of Patent: Nov. 24, 2015

(54) OPTOELECTRONIC DEVICE AND STACKING STRUCTURE

(75) Inventors: Hyun A Kang, Suwon-si (KR); Young Hwan Kim, Seongnam-si (KR); Eun Joo Jang, Suwon-si (KR); Shin Ae Jun, Seongnam-si (KR); Hyo Sook Jang, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 718 days.

(21) Appl. No.: 13/467,763

(22) Filed: May 9, 2012

(65) Prior Publication Data

US 2012/0293063 A1 Nov. 22, 2012

(30) Foreign Application Priority Data

May 20, 2011 (KR) .................. 10-2011-0047957

(51) Int. Cl.
*H01L 51/54* (2006.01)
*C09K 11/02* (2006.01)
*H01L 33/44* (2010.01)

(52) U.S. Cl.
CPC ............ *C09K 11/02* (2013.01); *H01L 33/44* (2013.01)

(58) Field of Classification Search
None
See application file for complete search history.

(56) References Cited

U.S. PATENT DOCUMENTS

| 5,585,035 A | 12/1996 | Nerad et al. | |
| 2007/0036962 A1 | 2/2007 | Sasaki et al. | |
| 2008/0173886 A1* | 7/2008 | Cheon et al. | 257/98 |
| 2010/0189918 A1 | 7/2010 | Cochet et al. | |
| 2011/0068362 A1* | 3/2011 | Negley et al. | 257/99 |

FOREIGN PATENT DOCUMENTS

| JP | 2007-070603 A | 2/2007 |
| KR | 1019967004006 A | 8/1996 |

OTHER PUBLICATIONS

Hoyle et al. J. Polym. Sci. Part A: Polym. Sci. 2004, 42, 5301-5038. Year of publication: 2004.*

* cited by examiner

*Primary Examiner* — Andrew K Bohaty
(74) *Attorney, Agent, or Firm* — Cantor Colburn LLP (57) ABSTRACT

Provided is an optoelectronic device that includes: a light source; an emission layer disposed on the light source and including light emitting particles dispersed in a matrix polymer; and a polymer film disposed on the emission layer. The polymer film includes two layers: a first layer including a first polymer and a second layer including a second polymer. The first polymer includes a polymerized product of a first monomer including at least two thiol (—SH) groups and a siloxane-based second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end.

20 Claims, 2 Drawing Sheets

OPTOELECTRONIC DEVICE AND STACKING STRUCTURE

CROSS-REFERENCE TO RELATED APPLICATION

This application claims priority to Korean Patent Application No. 10-2011-0047957, filed on May 20, 2011, and all the benefits accruing therefrom under 35 U.S.C. §119, the content of which in its entirety is herein incorporated by reference.

BACKGROUND

1. Field

This disclosure relates an optoelectronic device and a stacking structure.

2. Description of the Related Art

Semiconductor nanocrystals, which are also called quantum dots, are a semiconductor material with a nano-sized and crystalline structure, and include hundreds to thousands of atoms.

Since the semiconductor nanocrystals are very small, they have a large surface area per unit volume, and also have a quantum confinement effect. Accordingly, they have unique physicochemical properties that differ from the inherent characteristics of a corresponding bulk semiconductor material.

In particular, since optoelectronic properties of nanocrystals may be controlled by adjusting the size of the nanocrystals, the semiconductor nanocrystals are the subject of active research, and are being utilized in display devices and a variety of biotechnology applications.

When the semiconductor nanocrystal is used in a display element or the like, a silicone polymer may be used as a matrix resin for dispersing the semiconductor nanocrystal. However, the silicone polymer may not sufficiently protect the semiconductor nanocrystal due to its reduced oxygen and moisture barrier properties.

SUMMARY

An embodiment of this disclosure provides an optoelectronic device including a polymer film for improving the efficiency or the life-span of an optoelectronic device due to the excellent oxygen or moisture barrier properties.

Another embodiment of this disclosure provides a stacking structure including a polymer film having excellent oxygen and moisture barrier properties to improve the efficiency or the life-span of a stacking structure.

According to an embodiment of this disclosure, provided is an optoelectronic device that includes: a light source; an emission layer disposed on the light source and including light emitting particles dispersed in a matrix polymer; and a polymer film disposed on the emission layer. The polymer film includes a first polymer layer including a first polymer, and a second polymer layer including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end.

According to another embodiment of this disclosure, provided is a stacking structure that includes a composite layer including a matrix polymer and a light emitting particle dispersed in the matrix polymer, and a polymer film disposed on the composite layer. The polymer film includes a first polymer layer including a first polymer, and a second polymer layer including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end. As used herein, the term "terminal end" is inclusive of the terminal end of a side chain.

The first monomer and the third monomer including at least two thiol (—SH) groups may be each independently represented by the following Chemical Formula 1.

Chemical Formula 1

In Chemical Formula 1, $R^1$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C60 amine group (—NRR', wherein R and R' are each independently hydrogen or a linear or branched C1 to C30 alkyl group); an isocyanurate group; a (meth)acryloyloxy group; a halogen; —ROR' (wherein R is a substituted or unsubstituted C1 to C20 alkylene group and R' is hydrogen or a C1 to C20 alkyl group); C(=O)OR' (wherein R' is hydrogen or a C1 to C20 alkyl group); —CN; or —C(=O)ONRR' (wherein R and R' are each independently hydrogen or a C1 to C20 alkyl group), $L_1$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR—(wherein R is hydrogen or a linear or branched C1 to C10 alkyl group), or a combination thereof, m is an integer of 1 or more, k1 is an integer of 0 or 1 or more, k2 is an integer of 1 or more, and the sum of m and k2 is an integer of 3 or more, provided that m does not exceed the valance of $Y_1$, and provided that the sum of k1 and k2 does not exceed the valence of the $L_1$.

The siloxane-containing second monomer or oligomer including at least one carbon-carbon unsaturated bond at a terminal end may be represented by the following Chemical Formula 2.

Chemical Formula 2

In Chemical Formula 2,

$X^1$ to $X^3$ are each independently hydrogen, a substituted or unsubstituted C2 to C30 aliphatic organic group including a carbon-carbon unsaturated bond, a C6 to C30 aromatic organic group including a carbon-carbon unsaturated bond-containing substituent, or a substituted or unsubstituted C3 to C30 alicyclic organic group including a carbon-carbon unsaturated bond, or $X^1$ is a single bond to $X^2$ and $X^2$ is oxygen to provide a cyclic compound, provided that at least one of $X^1$ to $X^3$ comprises at least one carbon-carbon unsaturated bond, $R^1$ to $R^7$ are each independently hydrogen; a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C60 amine group (—NRR', (wherein R and R' are each independently hydrogen or a linear or branched C1 to C30 alkyl group); an isocyanate group; an isocyanurate group; a (meth)acryloyloxy group; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), and n and m are each independently integers ranging from 0 to 300.

The fourth monomer may be represented by the following Chemical Formula 3.

Chemical Formula 3

In Chemical Formula 3,

X is a substituted or unsubstituted C2 to C30 aliphatic organic group including a carbon-carbon unsaturated bond, a C6 to C30 aromatic organic group including a carbon-carbon unsaturated bond-containing substituent, or a substituted or unsubstituted C3 to C30 alicyclic organic group including a carbon-carbon unsaturated bond, $R^2$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C60 amine group (—NRR', wherein R and R' are each independently hydrogen or a linear or branched C1 to C30 alkyl group); an isocyanate group; an isocyanurate group; a (meth)acryloyloxy group; a halogen; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), $L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof, n is an integer of 1 or more, k3 is an integer of 0 or 1 or more, k4 is an integer of 1 or more, and the sum of n and k4 is an integer of 3 or more, provided that n does not exceed the valance of $Y_2$, and provided that the sum of k3 and k4 does not exceed the valence of the $L_2$.

The first monomer and the third monomer of the above Chemical Formula 1 may include a monomer of the following Chemical Formula 1-1.

Chemical Formula 1-1

In Chemical Formula 1-1,

$L_1'$ is a substituted or unsubstituted C1 to C30 alkylene group; a substituted or unsubstituted C6 to C30 arylene group, for example, a substituted or unsubstituted phenylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are each independently a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), or —NR— (wherein R is hydrogen or a linear or branched C1 to C10 alkyl group), and

$R_a$ to $R_d$ are a thiol group (—SH); or
one or more of the groups $R_a$—$Y_a$—, $R_b$—$Y_b$—, $R_b$—$Y_b$—, and $R_d$—$Y_d$— are $R_1$ of Chemical Formula 1, provided that at least two of $Y_a$ to $Y_d$ are as defined above and at least two of $R_a$ to $R_d$ are a thiol group (—SH).

In Chemical Formula 3, $L_2$ may be a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

The fourth monomer of the above Chemical Formula 3 may include the compounds represented by the following Chemical Formulas 3-1 and 3-2:

Chemical Formula 3-1

Chemical Formula 3-2

In Chemical Formulas 3-1 and 3-2, $Z_1$ to $Z_3$ are each independently *—$Y_2$—$X_n$ of the above Chemical Formula 3, wherein * represents the point of attachment to $L_2$.

The first monomer and the second monomer or oligomer of the first polymer layer, and the third monomer and the fourth monomer of the second polymer layer, may be respectively present during polymerization so that the thiol group of the first monomer or the third monomer and the unsaturated carbon-carbon bond of the second monomer or oligomer or the fourth monomer may be present at a mole ratio of thiol:unsaturated carbon-carbon double bond of about 1:about 0.75 to about 1:about 1.25.

The first polymer and the second polymer may be a polymerized product that is obtained by further polymerizing a fifth monomer having one thiol group located at a terminal end of the fifth monomer, a sixth monomer having one unsaturated carbon-carbon bond located at a terminal end of the sixth monomer, or a combination thereof.

The matrix polymer or the second matrix polymer may be a silicone resin.

The silicone resin may be a polymer that is obtained by curing a siloxane-containing compound that is the same as the second monomer or oligomer including at least one carbon-carbon unsaturated bond at a terminal end used to form the first polymer layer.

The light emitting particle of an optoelectronic device or a stacking structure may be a semiconductor nanocrystal selected from a Group II-VI compound, a Group III-V compound, a Group IV-VI compound, a Group IV compound, and a combination thereof.

The light emitting particle may be pre-coated with a polymer having a carboxyl group or a salt thereof.

The optoelectronic device may further include a transparent plate between the light source and the emission layer to separate them.

Embodiments of this disclosure will be further described in the following detailed description.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

This disclosure will be described more fully hereinafter with reference to the accompanying drawings, in which various embodiments are shown. This disclosure may, however be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used here, the singular forms "a", "an" and "the" are intended to include the plural forms as well, unless the content clearly indicates otherwise. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and the present disclosure, and will not be interpreted in an idealized or overly formal sense unless expressly so defined herein.

An "alkyl" group is a saturated aliphatic hydrocarbyl group having the specified number of carbon atoms, a valence of one, and optionally substituted with one or more substituents where indicated.

An "alkenyl" group is a hydrocarbyl group having the specified number of carbon atoms, a valence of one, at least one carbon-carbon double bond, and optionally substituted with one or more substituents where indicated.

An "alkynyl" group is a hydrocarbon having the specified number of carbon atoms a valence of one, at least one carbon-carbon triple bond, and optionally substituted with one or more substituents where indicated.

A "cycloalkyl" group is a hydrocarbyl group having one or more saturated rings in which all ring members are carbon, the specified number of carbon atoms, a valence of one, and optionally substituted with one or more substituents where indicated. Non-limiting examples include cyclopropyl, cyclobutyl, cyclopentyl, cyclohexyl, cycloheptyl, cyclooctyl, and adamantly groups. A "cycloalkenyl" group is a cylcoalkyl group having at least one carbon-carbon double bond in the ring, and a "cycloalkynyl" group is a cycloalkyl group having at least one carbon-carbon triple bond in the ring. Cycloalkyl, cycloalkenyl, and cycloalkynyl groups do not contain an aromatic ring or a heterocyclic ring.

An "aryl" group is a carbocyclic ring system that includes one or more aromatic rings in which all ring members are carbon, having the specified number of carbon atoms, a valence of one, and optionally substituted with one or more substituents where indicated. More than one ring may be present, and any additional rings may be independently aromatic, saturated, or partially unsaturated and multiple rings, if present, may be fused, pendent, spirocyclic or a combination thereof. Non-limiting examples include phenyl, naphthyl, and tetrahydronaphthyl groups.

An "alkylene" group is an alkyl group having the specified number of carbon atoms, a valence of two or higher, and optionally substituted with one or more substituents where indicated.

An "alkenylene" group is an alkenyl group having the specified number of carbon atoms, a valence of two or higher, and optionally substituted with one or more substituents where indicated.

A "cycloalkylene" group is cycloalkyl group having one or more saturated rings in which all ring members are carbon, the specified number of carbon atoms, a valence of two or higher, and optionally substituted with one or more substituents where indicated.

An "arylene" group is an aryl group having the specified number of carbon atoms, and a valence of two or higher wherein the points of attachment may be on the same or different rings, each of which rings may be aromatic or non-aromatic, and optionally substituted with one or more substituents where indicated. Non-limiting examples include phenylene and naphthylene.

As used herein, when a definition is not otherwise provided, the term "substituted" may refer to a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (F, Cl, Br, or I), a hydroxy group, a C1 to C30 alkoxy group, a nitro group ($-NO_2$), a cyano group ($-CN$), an amino group ($-NRR'$, wherein R and R' are hydrogen or a C1 to C6 alkyl group), an azido group ($-N_3$), an amidino group ($-C(=NH)NH_2$), a hydrazino group ($-NHNH_2$), a hydrazono group ($=N(NH_2)$), an aldehyde group ($-C(=O)H$), a carbamoyl group ($-C(O)NH_2$), a thiol group ($-SH$), an ester group ($-C(=O)OR$ wherein R is a C1 to C6 alkyl group or a C6 to C12 aryl group), a carboxyl group ($-C(=O)OH$) or a salt thereof ($-C(=O)OM$ wherein M is an organic or inorganic cation), a sulfonic acid group ($-SO_3H$) or a salt thereof ($-SO_3M$ wherein M is an organic or inorganic cation), a phosphoric acid group ($-PO_3H_2$) or a salt thereof ($-PO_3MH$ or $-PO_3M_2$ wherein M is an organic or inorganic cation), instead of hydrogen, provided that the substituted atom's normal valence is not exceeded.

Throughout the present disclosure, reference is made to various heterocyclic groups. Within such groups, the prefix "hetero" refers to a group that includes at least one ring member (e.g., 1 to 4 ring members) that is a heteroatom (e.g., 1 to 4 heteroatoms, each independently being N, O, S, Si, or P).

As used herein, the term "aliphatic organic group" may refer to a linear or branched substituted or unsubstituted C1 to C30 alkyl group, a linear or branched substituted or unsubstituted C2 to C30 alkenyl group, and a linear or branched substituted or unsubstituted C2 to C30 alkynyl group, each of which may contain up 3 heteroatoms each independently being N, O, S, Si, or P, the term "aromatic organic group" may refer to a substituted or unsubstituted C6 to C30 aryl group or a substituted or unsubstituted C2 to C30 heteroaryl group, and the term "alicyclic organic group" may refer to a substituted or unsubstituted C3 to C30 cycloalkyl group, a substituted or unsubstituted C3 to C30 cycloalkenyl group, and a substituted or unsubstituted C3 to C30 cycloalkynyl group, each of which may contain up to 3 heteroatoms each independently being N, O, S, Si, or P.

As used herein, the term "carbon-carbon unsaturated bond-containing substituent" may include a C2 to C20 alkenyl group including at least one carbon-carbon double bond, a C2 to C20 alkynyl group including at least one carbon-carbon triple bond, a C4 to C20 cycloalkenyl group including at least one carbon-carbon double bond in a ring, or a C4 to C20 cycloalkenyl group including at least one carbon-carbon triple bond in a ring.

As used herein, the term "combination thereof" refers to a mixture, a stacked structure, a composite, an alloy, a blend, a reaction product, or the like.

As used herein, (meth)acrylate refers to an acrylate or a methacrylate, and (meth)acryloyloxy refers to acryloyloxy and methacryloyloxy.

According to an embodiment of this disclosure, provided is an optoelectronic device that includes: a light source; an emission layer disposed on the light source and including a light emitting particle dispersed in a matrix polymer; and a polymer film disposed on the emission layer. The polymer film includes a first polymer layer including a first polymer, and a second polymer layer including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end.

The first monomer and the third monomer including at least two thiol (—SH) groups may be each independently represented by the following Chemical Formula 1.

Chemical Formula 1

In Chemical Formula 1, $R^1$ is hydrogen; a substituted or unsubstituted linear or branched C1 to C30 or C1 to C10 alkyl group; a substituted or unsubstituted C6 to C30 or C6 to C12 aryl group; a substituted or unsubstituted C3 to C30 or C3 to C12 heteroaryl group; a substituted or unsubstituted C3 to C30 or C3 to C12 cycloalkyl group; a substituted or unsubstituted C3 to C30 or C3 to C12 heterocycloalkyl group; a C2 to C30 or C2 to C10 alkenyl group; a C2 to C30 or C2 to C10 alkynyl group; a substituted or unsubstituted C3 to C30 or C3 to C12 alicyclic organic group including a double bond or triple bond in a ring; a substituted or unsubstituted C3 to C30 or C3 to C12 heterocycloalkyl group including a double bond or triple bond in a ring; a C3 to C30 or C3 to C12 alicyclic organic group substituted with a C2 to C30 or C2 to C10 alkenyl group or a C2 to C30 or C2 to C10 alkynyl group; a C3 to C30 or C3 to C12 heterocycloalkyl group substituted with a C2 to C30 or C2 to C10 alkenyl group or a C2 to C30 or C2 to C10 alkynyl group; a hydroxyl group; $NH_2$; a substituted or unsubstituted C1 to C60 or C1 to C20 amine group (—NRR', wherein each R and R' are independently hydrogen or a linear or branched C1 to C30 or C1 to C10 alkyl group); an isocyanurate group; a (meth)acryloyloxy group; a halogen; —ROR' (wherein R is a substituted or unsubstituted C1 to C20 or C1 to C10 alkylene group and R' is hydrogen or a linear or branched C1 to C20 or C1 to C10 alkyl group); —C(=O)OR' (wherein R' is hydrogen or a linear or branched C1 to C20 or C1 to C10 alkyl group); —CN; or —C(=O)ONRR' (wherein R and R' are each independently hydrogen or a linear or branched C1 to C20 or C1 to C10 alkyl group), $L_1$ is a single bond, a substituted or unsubstituted C1 to C30 or C1 to C10 alkylene group, a substituted or unsubstituted C6 to C30 or C6 to C12 arylene group, a substituted or unsubstituted C6 to C30 or C3 to C12 heteroarylene group, a substituted or unsubstituted C3 to C30 or C3 to C12 cycloalkylene group, or a substituted or unsubstituted C3 to C30 or C3 to C12 heterocycloalkylene group,

$Y_1$ is a single bond; a substituted or unsubstituted C1 to C30 or C1 to C10 alkylene group; a substituted or unsubstituted C2 to C30 or C2 to C10 alkenylene group; a C1 to C30 or C1 to C10 alkylene group or a C2 to C30 or C2 to C10 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof, m is an integer of 1 or more, k1 is an integer of 0 or 1 or more, k2 is an integer of 1 or more, and the sum of m and k2 is an integer of 3 or more, provided that m does not exceed the valance of $Y_1$ and provided that the sum of k1 and k2 does not exceed the valence of $L_1$.

The siloxane-containing second monomer or oligomer including at least one carbon-carbon unsaturated bond at a terminal end may be represented by the following Chemical Formula 2.

Chemical Formula 2

In Chemical Formula 2, $X^1$ to $X^3$ are each independently hydrogen, a substituted or unsubstituted C2 to C30 aliphatic organic group including a carbon-carbon unsaturated bond, a C6 to C30 aromatic organic group including a carbon-carbon unsaturated bond-containing substituent, or a substituted or unsubstituted C3 to C30 alicyclic organic group including a carbon-carbon unsaturated bond or $X^1$ is a single bond to $X^2$ and $X^2$ is oxygen to provide a cyclic compound, provided that at least one of $X^1$ to $X^3$ comprises at least one carbon-carbon unsaturated bond,

$R^1$ to $R^7$ are each independently hydrogen; a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C60 amine group (—NRR'), (wherein R and R' are each independently hydrogen or a linear or branched C1 to C30 alkyl group); an isocyanate group; an isocyanurate group; a (meth)acryloyloxy group; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), and n and m are each independently integers ranging from 0 to 300.

The siloxane-containing second monomer or oligomer including at least one carbon-carbon unsaturated bond at a terminal end may have a molecular weight of about 500 grams/mole to about 100,000 grams/mole, and specifically about 1000 grams/mole to about 10,000 grams/mole. The molecular weight may be a weight average molecular weight if the siloxane-containing second monomer or oligomer is an oligomeric compound. Within the above molecular weight, reactivity of the siloxane-containing second monomer or oligomer and a first monomer including at least two thiol (—SH) groups may be easily controlled.

The fourth monomer may be represented by the following Chemical Formula 3.

Chemical Formula 3

In Chemical Formula 3,

X is a substituted or unsubstituted C2 to C30 or C2 to C10 aliphatic organic group including a carbon-carbon unsaturated bond, a C6 to C30 or C6 to C12 aromatic organic group including a carbon-carbon unsaturated bond-containing substituent, or a substituted or unsubstituted C3 to C30 or C3 to C12 alicyclic organic group including a carbon-carbon unsaturated bond, $R^2$ is hydrogen; a substituted or unsubstituted linear or branched C1 to C30 or C1 to C10 alkyl group; a substituted or unsubstituted C6 to C30 or C6 to C12 aryl group; a substituted or unsubstituted C3 to C30 or C3 to C12 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; $NH_2$; a substituted or unsubstituted C1 to C60 amine group (—NRR', wherein R and R' are each independently hydrogen or a linear or branched C1 to C30 alkyl group); an isocyanate group; an isocyanurate group; a (meth)acryloyloxy group; a halogen; —ROR' (wherein R is a substituted or unsubstituted C1 to C20 alkylene group and R' is hydrogen or a linear or branched C1 to C20 alkyl group); an acyl halide group (—RC(=O)X, wherein R is a substituted or unsubstituted alkylene group and X is a halogen); —C(=O)OR' (wherein R' is hydrogen or a linear or branched C1 to C20 alkyl group); —CN; or —C(=O)ONRR' (wherein R and R' are each independently hydrogen or a linear or branched C1 to C20 alkyl group), $L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group,

$Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof, n is an integer of 1 or more, k3 is an integer of 0 or 1 or more, k4 is an integer of 1 or more, and the sum of n and k4 is an integer of 3 or more, provided that n does not exceed the valence of $Y_2$; and provided that the sum of k3 and k4 does not exceed the valence of $L_2$.

The first monomer and the third monomer of the above Chemical Formula 1 may each independently include a monomer of the following Chemical Formula 1-1.

Chemical Formula 1-1

In Chemical Formula 1-1,

$L_1'$ is a substituted or unsubstituted C1 to C30 alkylene group, a substituted or unsubstituted C6 to C30 arylene group, for example, a substituted or unsubstituted phenylene group; a substituted or unsubstituted C3 to C30 heteroarylene group, for example, a triazine group; a substituted or unsubstituted C3 to C30 cycloalkylene group; or a substituted or unsubstituted C3 to C30 heterocycloalkylene group, for example a trioxotriazine group such as in Chemical Formula 1-5 below, $Y_a$ to $Y_d$ are each independently a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—O(=O)O—), an amide group (—C(=O)NR—) (wherein R is hydrogen or a linear or branched C1 to C10 alkyl group), or —NR— (wherein R is hydrogen or a linear or branched C1 to C10 alkyl group), and

$R_a$ to $R_d$ are a thiol group (—SH); or one or more of the groups $R_a$—$Y_a$—, $R_b$—$Y_b$—, $R_c$—$Y_c$—, and $R_d$—$Y_d$— are $R_1$ of Chemical Formula 1, provided that at least two of $Y_a$ to $Y_d$ are as defined above and at least two of $R_a$ to $R_d$ are a thiol group (—SH).

Examples of the first monomer and the third monomer of the above Chemical Formula 1 may include a monomer of the following Chemical Formulas 1-2 to 1-5.

Chemical Formula 1-2

Chemical Formula 1-3

Chemical Formula 1-4

Chemical Formula 1-5

$X^1$ to $X^3$ in Chemical Formula 2 and X in Chemical Formula 2 may be a substituted or unsubstituted C2 to C30 aliphatic organic group including a carbon-carbon double bond or a carbon-carbon triple bond, a C6 to C30 aromatic organic group including a substituent with a carbon-carbon double bond or a carbon-carbon triple bond, or a substituted or unsubstituted C3 to C30 alicyclic organic group including a carbon-carbon double bond or a carbon-carbon triple bond. In an embodiment, $X^1$ is a single bond to $X^2$ and $X^2$ is oxygen such at that $X^1$ and $X^2$ together form a cyclic compound. In this embodiment, $X^3$ contains at least one terminal carbon-carbon unsaturated bond.

The $X^1$ to $X^3$ in Chemical Formula 2 and X in Chemical Formula 3 may be an acryloyloxy group; a methacryloyloxy group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; or a C3 to C30 heterocycloalkyl group substituted with a C2 to C30 alkenyl group or a C2 to C30 alkynyl group.

In the definitions of $X^1$ to $X^3$ of Chemical Formula 2 and X of Chemical Formula 3, $X^1$ to $X^3$ and X may each independently be a vinyl group, an allyl group, a 2-butenyl group, or a combination thereof. The $X^1$ to $X^3$ and X groups may each independently also be a norbornene group, a maleimide group, a nadimide group, a tetrahydrophthalimide group, or a combination thereof.

In Chemical Formula 3, $L_2$ may be a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group such as in Chemical Formula 3-4 below, or a substituted or unsubstituted isocyanurate group.

The fourth monomer of the above Chemical Formula 3 may include the compounds represented by the following Chemical Formulas 3-1 and 3-2.

Chemical Formula 3-1

Chemical Formula 3-2

In Chemical Formulas 3-1 and 3-2, $Z_1$ to $Z_3$ are each independently *—$Y_2$—$X_n$ as defined for the above Chemical Formula 3, wherein * represents the point of attachment to $L_2$.

Examples of the fourth monomer of the above Chemical Formula 3 may include the compounds represented by the following Chemical Formulas 3-3 to 3-5.

Chemical Formula 3-3

Chemical Formula 3-4

Chemical Formula 3-5

The first monomer and the second monomer or oligomer of the first polymer layer may be used so that the thiol group of the first monomer and the unsaturated carbon-carbon bond of the second monomer or oligomer may be present at a mole ratio of about 1:about 0.75 to about 1:about 1.25. The third monomer and the fourth monomer or oligomer of the second polymer layer may be used so that the thiol group of the third monomer and the unsaturated carbon-carbon bond of the fourth monomer or oligomer may be present at a mole ratio of about 1:about 0.75 to about 1:about 1.25. When the above monomers are used within the mole ratio range, a polymer having excellent mechanical strength and properties due to a high density network may be provided.

The first polymer may be a polymerized product which is obtained by further polymerizing a fifth monomer having one thiol group located at a terminal end of the fifth monomer, a sixth monomer having one unsaturated carbon-carbon bond located at a terminal end of the sixth monomer, or a combination thereof.

The second polymer may also be a polymerized product that is obtained by further polymerizing a fifth monomer having one thiol group located at a terminal end of the fifth monomer, a sixth monomer having one unsaturated carbon-carbon bond located at a terminal end of the sixth monomer, or a combination thereof.

The fifth monomer may be a compound in which each m and k2 is 1 in Chemical Formula 1, and the sixth monomer may be a compound in which each n and k4 is 1 in Chemical Formula 3.

The first polymer may be a polymerized product that is obtained by polymerizing each of a first monomer and a second monomer or oligomer and selectively a fifth monomer and/or a sixth monomer under the presence of an initiator for accelerating the cross-linking reaction of the thiol group and carbon-carbon unsaturated bond. In addition, the second polymer may be a polymerized product that is obtained by polymerizing each of a third monomer and a fourth monomer or oligomer and selectively a fifth monomer and/or a sixth monomer under the presence of an initiator for accelerating the cross-linking reaction of the thiol group and carbon-carbon unsaturated bond. The initiator may include phosphine oxide, α-amino ketone, phenylglyoxylate, monoacyl phosphine, benzyldimethyl-ketal, hydroxyketone, and the like.

The first polymer and the second polymer may be cured at room temperature for a short time, so that the high temperature process that may deteriorate the stability of the light emitting particles may be omitted. Particularly, the second polymer may block extraneous factors such as oxygen, moisture, or the like, by providing a close cross-linking structure.

The first polymer has excellent affinity for the matrix polymer of the light emitting particles, and a layer of the first polymer is disposed between the matrix polymer and a layer of the second polymer to improve the interface adherence therebetween.

In an embodiment, when the matrix polymer of light emitting particles is a silicone resin, the matrix polymer has excellent affinity for the first polymer since the first polymer includes the siloxane-containing second monomer or oligomer, which is similar to the monomers used for preparing the silicone resin. In addition, since both the first polymer and the second polymer are polymerized from a monomer having at least two thiol groups, there is an excellent affinity between the first polymer and the second polymer. Accordingly, the first polymer of a first polymer layer may improve the interlayer interface adherence and the uniformity of the layer by improving the affinity of a matrix polymer and a second polymer.

The matrix polymer of silicone resin may be a polymer that is obtained by curing the same siloxane-containing second monomer or oligomer including at least one carbon-carbon unsaturated bond. In this case, it may further improve the interface adherence of a matrix polymer and a first polymer layer.

The first monomer including at least two thiol (—SH) groups of the first polymer layer may be the same as the third monomer including at least two thiol (—SH) groups of the second polymer layer. In this case, it may further improve the interface adherence of the first polymer layer and the second polymer layer.

The first polymer layer may have a thickness of about 5 micrometers to about 200 micrometers, for example, a thickness of about 20 micrometers to about 100 micrometers. When the first polymer layer has a thickness within this range, it may improve the interface adherence of a matrix resin and a second polymer layer. In addition, the second polymer layer may have a thickness of about 5 micrometers to about 1000 micrometers, for example, a thickness of about 50 micrometers to about 300 micrometers. When the second polymer layer has a thickness within this range, it may sufficiently block the extraneous factors of oxygen or moisture or the like.

The optoelectronic device according to another embodiment may further include a transparent plate spatially separating a light source from a light emitting particle. The optoelectronic device may include a light source; a first matrix polymer disposed on the light source; a transparent plate covering the first matrix polymer; an emission layer which includes light emitting particles dispersed in a second matrix polymer disposed on the transparent plate; and a polymer film disposed on the emission layer, wherein the polymer film includes a first polymer layer including a first polymer, and a second polymer layer including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end.

The first matrix polymer and the second matrix polymer may be a silicone resin. Particularly, when the second matrix polymer in which the light emitting particles are dispersed is a silicone resin, the second matrix polymer may have an excellent affinity for the first polymer, since the first polymer includes the siloxane-containing second monomer or oligomer similar to the monomers for preparing the silicone resin.

The transparent plate may be made of glass or a transparent polymer. The polymer film is the same as above.

As an example of an organic optoelectronic device, a light emitting diode device is described with reference to FIG. 1 and FIG. 2.

Figure 1:
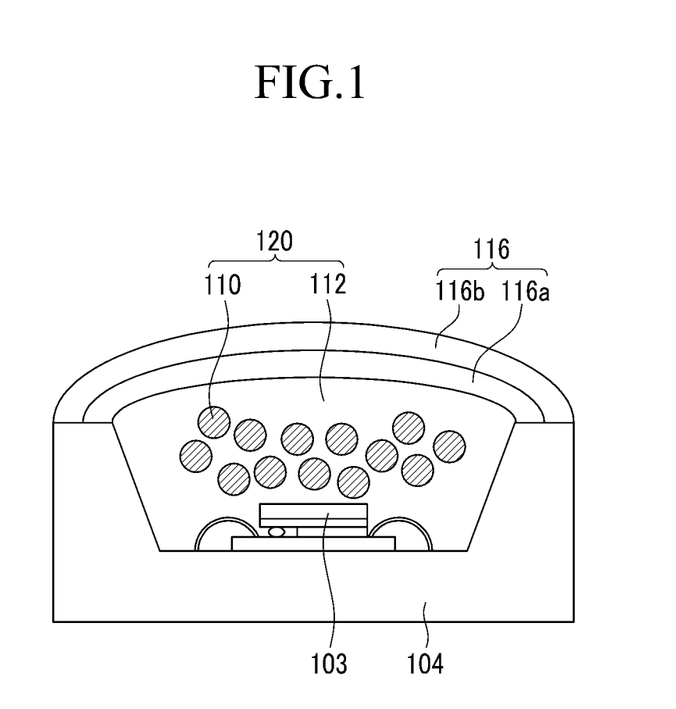
FIG. 1 is a cross-sectional view of a light emitting diode according to an embodiment as disclosed herein.
Figure 2:
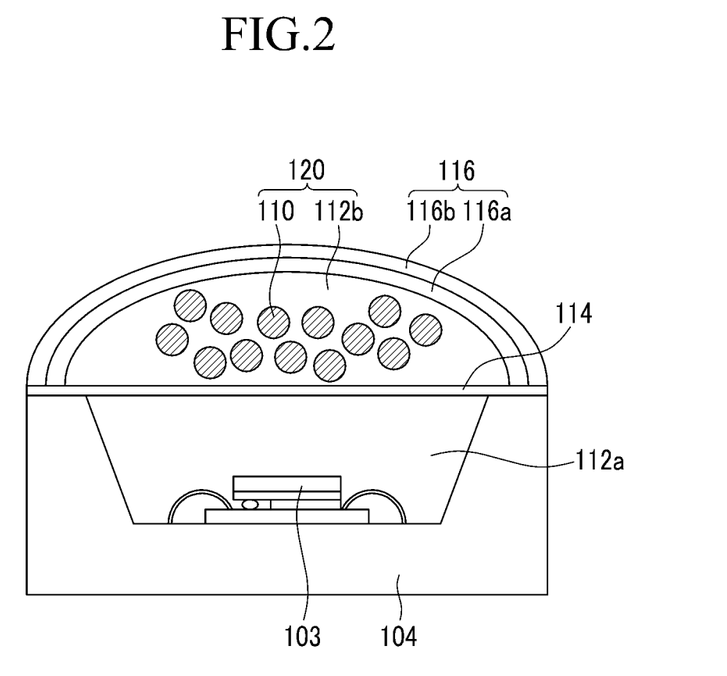
FIG. 2 is a cross-sectional view of a light emitting diode according to another embodiment as disclosed herein.

FIG. 1 and FIG. 2 are cross-sectional views showing light emitting diode devices according to the various embodiments of the present disclosure.

Referring to FIG. 1, the light emitting diode device includes a substrate 104 including Ag or the like, a light emitting diode chip 103 disposed on the substrate 104 and corresponding to the blue or ultraviolet region, and light emitting particles 110 disposed on the light emitting diode chip 103, wherein the light emitting particles 110 are dispersed in a matrix polymer 112. The outer surface of the light emitting diode device is encapsulated with a polymer film 116. The polymer film 116 includes a first polymer layer 116a including a first polymer, and a second polymer layer 116b including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end.

As a light source of the light emitting diode, a laser, a lamp, or the like may be used instead of the light emitting diode chip.

The light emitting particles 110 may be red, green, yellow, or blue-emitting light emitting particles. The light emitting particles may be a nanocrystal, a phosphor, a pigment, or a combination thereof. The nanocrystal may be a semiconductor nanocrystal, a metal nanocrystal, a metal oxide nanocrystal, or a combination thereof. The semiconductor nanocrystal may include a Group II-VI compound, a Group III-V compound, a Group IV-VI compound, a Group IV compound, or a combination thereof, wherein the term "Group" refers to a group of the Periodic Table of the Elements.

The Group II-VI compound includes a binary compound selected from CdSe, CdTe, ZnS, ZnSe, ZnTe, ZnO, HgS, HgSe, HgTe, MgSe, MgS, and a mixture thereof; a ternary compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound includes a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; or a quaternary compound selected from GaAlNAs, GaAlNSb, GaAlPAs, GaAlPSb, GaAlInP, GaInNAs, GaInNSb, GaInPAs, GaInPSb, InAlNP, InAlNAs, InAlNSb, InAlPAs, InAlPSb, and a mixture thereof. The Group IV-VI compound includes a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; or a quaternary compound selected from SnPbSSe, SnPbSeTe, SnPbSTe, and a mixture thereof. The Group IV element includes Si or Ge, and the Group IV compound includes a binary compound selected from SiC, SiGe, or a combination thereof.

According to an embodiment, the element, the binary compound, the ternary compound, or the quaternary compound may be present in a particle having a substantially uniform concentration, or may be present in a particle having different concentration distributions in the same particle. In addition, each particle may have a core/shell structure in which a first semiconductor nanocrystal is surrounded by a second semiconductor nanocrystal. The core and shell may have an interface, and an element of at least one of the core or the shell may have a concentration gradient that decreases in a direction from the surface of the particle to a center of the particle.

In addition, the semiconductor nanocrystal may have a structure including a semiconductor nanocrystal core and a multi-layer shell surrounding the same. The multi-layer shell may have a two or more layered shell structure. Each layer may have a single composition or an alloy or concentration gradient.

In addition, the semiconductor nanocrystal may have a structure effectively showing the quantum confinement effect since the material composition for the shell has a higher energy band gap than that of the core. In the case of having a multi-layered shell, the energy band gap of the shell disposed on the exterior of the core is higher than the shell closer to the core. The semiconductor nanocrystal may have an ultraviolet ("UV") to infrared wavelength range.

The semiconductor nanocrystal may have quantum efficiency of about 30% to about 100%, for example, about 50% or more, or about 70% or more, or about 90% or more. Within the range, it may improve the luminous efficiency of a device.

In addition, the full width of half maximum ("FWHM") of the light emitting wavelength spectrum of the semiconductor nanocrystal may be designed to be narrower or wider according to the application field. It may have a narrower spectrum in order to improve the color purity or the color reproducibility in a display. Specifically, the semiconductor nanocrystal may have the FWHM of light emitting wavelength spectrum of about 50 nanometers ("nm") or less, for example, about 40 nm or less, or about 30 nm or less. In the range, it may improve the color purity or the color reproducibility of the device. In addition, when the semiconductor nanocrystal is used for lighting or the like, mixtures of semiconductor nanocrystals having various light emitting wavelengths may be used in order to improve the color rendering index ("CRI"), or the FWHM is designed to be wider. In this case, the FWHM may range from about 100 nm to about 200 nm.

The semiconductor nanocrystal may have a particle diameter (e.g., an average largest particle diameter) ranging from about 1 nanometer ("nm") to about 100 nm, and specifically about 1 nm to about 10 nm.

In addition, the nanocrystal may have a commonly-used shape in this art so the shape is not specifically limited. Examples thereof may include spherical, pyramid, multi-arm, or cubic nanoparticles, nanotubes, nanowires, nanofiber, nanoplate particles, or the like.

The nanocrystal may be synthesized according to a general method known in this art. For example, the nanocrystal may be synthesized according to the following method. The method of synthesizing the nanocrystal is not limited to the following method, and it may be synthesized according to any conventional method known in the arts.

For example, several nano-sized semiconductor nanocrystals may be synthesized according to a wet chemical process that adds a precursor material into an organic solvent and develops the particles. This is a method of controlling crystal growth by naturally coordinating an organic solvent or an organic ligand on the surface of the semiconductor nanocrystal while the crystal is growing. The organic solvent coordinated on the surface of the nanocrystal may affect the stability in the device, so excessive organic material that is not coordinated on the surface of the nanocrystal may be removed by washing three times and centrifuging. After removing the excessive organic material, the amount of organic material coordinated on the surface of the nanocrystal may be about 50 wt % or less of the nanocrystal weight. With a nanocrystal size of about 20 nm or less, the organic material is coordinated in a range of about 10 to about 50 wt %, for example, about 15 to about 30 wt %, based on the weight of the nanocrystal. The organic material may be a monomer or an oligomer having a molecular weight of about 300 grams/mole or more or a polymer having a molecular weight ("Mw") of about 5000 grams/mole or more.

The phosphor and pigment may be a commonly-used phosphor and pigment, and is not specifically limited.

The light emitting particle may further include a coating with a polymer having a carboxyl group or a salt thereof. Thus, the light emitting particles may be pre-coated with a polymer having a carboxyl group or a salt thereof. The carboxyl group may include an acrylic acid group, a methacrylic acid group, or a salt thereof. The polymer having a carboxyl group or a salt thereof may include about 1 to about 100 mol %, specifically about 2 to about 50 mol %, more specifically about 4 to about 20 mol % of a unit including the carboxyl group or a salt thereof. When the unit including a carboxyl group or a salt thereof is included within the above range in the polymer, the stability of the light emitting particles may be improved. The polymer may have a melting point ("$T_m$") of about 50° C. to about 300° C., specifically about 60° C. to about 250° C., more specifically about 70° C. to about 200° C. When the polymer has a melting point within the above range, the polymer may stably coat the light emitting particle.

The coated light emitting particle may be present as a powder or as a film. A coated light emitting particle in a form of a powder and a matrix polymer may be combined to provide a composite, or alternatively, a coated light emitting particle in a form of a film and a matrix polymer may be combined to provide a composite. The polymer having a carboxyl group or a salt thereof may include the carboxyl group or a salt thereof in a long aliphatic chain, for example a C8 to C50 or a C12 to C36 aliphatic chain.

The polymer having a carboxyl group or a salt thereof may include a poly(alkylene-co-acrylic acid) such as poly(ethylene-co-acrylic acid), a poly(alkylene-co-methacrylic acid) such as poly(ethylene-co-methacrylic acid), a salt thereof, or a combination thereof. The salt may be a compound including a metal such as sodium, zinc, indium, gallium, or the like, instead of a hydrogen of the carboxyl group.

Examples of the salt include a poly(ethylene-co-acrylic acid) zinc salt, a poly(ethylene-co-methacrylic acid) zinc salt, or the like.

The polymer having a carboxyl group or a salt thereof may be present in an amount of about 50 to about 10,000 parts by weight, and specifically about 150 to about 10,000 parts by weight, based on 100 parts by weight of the light emitting particle. In the light emitting particle coated with the polymer having a carboxyl group or a salt thereof, the light emitting particles may be present in an amount of about 1 to about 70 wt %, and specifically about 1 to about 40 wt %, based on the total weight of the light emitting particles and the polymer having a carboxyl group or a salt thereof. When the composition of the coated light emitting particles is within the foregoing range, stability of the light emitting particles may be improved.

The matrix polymer 112 of FIG. 1 may be selected from a silicone resin, an epoxy resin, or a (meth)acrylate-based resin, for example, a silicone resin.

Referring to FIG. 2, the light emitting diode device includes a substrate 104 including Ag or the like, a light emitting diode chip 103 disposed on the substrate and corresponding to the blue or ultraviolet (UV) region, and a matrix polymer 112*a* filled in the recess portion of substrate 104. It may include a transparent plate 114 on the first matrix polymer 112*a*, and a second matrix polymer 112*b* and light emitting particles 110 dispersed in the same are disposed on the transparent plate 114. Thus, the transparent plate 114 is disposed between the light source 103 and the emission layer 120. The transparent plate 114 may be made of glass or a transparent polymer. The transparent plate 114 may prevent deterioration of the light emitting particles 110 by the light emitting diode chip 103.

The first matrix polymer 112*a* may be the same as or different from the second matrix polymer 112*b*. The first matrix polymer 112*a* may be a silicone resin having excellent transparency and refractive index characteristics and a high thermal stability, and the second matrix polymer 112*b* may be a polymer that improves the characteristics of uniformly dispersing the light emitting particles such as a silicone resin, an epoxy resin, a (meth)acrylate-based resin, or the like.

The emission layer 120 (FIG. 1 and FIG. 2) of the light emitting diode device is encapsulated with a polymer film 116. The polymer film 116 includes a first polymer layer 116*a* including a first polymer, and a second polymer layer 116*b* including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end. Each of the first monomer and the second monomer or oligomer and the third monomer and the fourth monomer, used for preparing the first polymer and the second polymer, respectively, may be polymerized in various mole ratios, and the mole ratio for the polymerization is not limited to a certain range.

In FIG. 1 and FIG. 2, the first polymer layer 116*a* may improve the interface adherence between a matrix polymer (112, 112*b*) and a second polymer layer 116*b*.

The interface adherence may be further improved if the matrix polymer (112, 112*b*) is a silicone resin. This is because the first polymer layer 116*a* includes polymerization components of the siloxane-containing second monomer or oligomer, similar to the monomer for preparing the silicone resin, so as to improve the affinity for polymers. In this regard, the silicone resin used for the matrix polymer (112, 112*b*) may be a polymer in which a siloxane-containing second monomer or oligomer including at least one carbon-carbon unsaturated bond is cured.

In addition, when the first monomer including at least two thiol (—SH) groups is the same as the third monomer including at least two thiol (—SH) groups, the interface adherence of the first polymer layer 116*a* and the second polymer layer 116*b* may be further improved.

The light emitting particle 110 absorbs the light emitting energy of the light emitting diode chip 103 and emits the excited energy as light having a different wavelength. The light emitting particle 110 may control the light emitting wavelength in various ways. For example, when a red light emitting particle and a green light emitting particle are associated with a blue light emitting diode, it may provide a white light emitting diode device. Alternatively, when red, green, and blue light emitting particles are associated with the ultraviolet ("UV") light emitting diode chip, it may provide a white light emitting diode device. In addition, when a light emitting particle emitting light in various wavelengths is associated with a light emitting diode chip, it may provide a light emitting diode emitting light in the various wavelengths.

According to another embodiment of the present disclosure, provided is a stacking structure that includes a composite layer including a matrix polymer and a light emitting particle dispersed in the matrix polymer, and a polymer film disposed on the composite layer. The polymer film includes a first polymer layer including a first polymer, and a second polymer layer including a second polymer. The first polymer includes a polymerized product of a first monomer including at least two thiol (—SH) groups and a siloxane-containing second monomer or oligomer including at least one carbon-carbon unsaturated bond at a terminal end, and the second polymer includes a polymerized product of a third monomer including at least two thiol (—SH) groups and a fourth monomer including at least two carbon-carbon unsaturated bonds at a terminal end. The first, third, and fourth monomers, and the second monomer or oligomer, may be the same as described above for an optoelectronic device, including Chemical Formulas 1, 2 and 3. The light emitting particle of the stacking structure may also be the same as described above for an optoelectronic device.

The stacking structure may be utilized in various devices, and may stably maintain the photo-characteristics of a device by effectively protecting the light emitting particles that are susceptible to oxygen or moisture. For example, the stacking structure may be utilized in various physiological fields, as well as in an optoelectronic device such as a light emitting element of a light emitting diode ("LED") device or an organic light emitting diode ("OLED"), a memory device, a laser device, a solar cell, or the like.

Hereinafter, the embodiments are illustrated in more detail with reference to examples. However, the following are exemplary embodiments and are not limiting of the claims.

Preparation Example 1

Synthesis of a Nanocrystal

About 16 grams ("g") of trioctylamine ("TOA"), about 0.3 g of octadecyl phosphonic acid, and 0.4 millimoles ("mmol") of cadmium oxide are simultaneously introduced into a 125 milliliter ("ml") flask mounted with a reflux condenser under vacuum while undergoing agitation, and heated to about 120° C. Then, after the temperature reaches about 120° C., nitrogen is flowed therein and the reaction temperature is increased to about 300° C.

Separately, selenium ("Se") powder is dissolved in trioctylphosphine ("TOP") to provide a 2 M Se-TOP complex solution. About 2 ml of 2 M Se-TOP complex solution is quickly injected into the reaction mixture that is agitated at about 300° C. and reacted for about 2 minutes.

After completing the reaction, the temperature of the reaction mixture is cooled as quickly as possible to room temperature, and a non-solvent of ethanol is added and centrifugation is performed. The supernatant of the solution excluding the centrifuged precipitant is discarded, and the precipitant is dispersed in toluene to prepare a cadmium-selenium ("CdSe") nanocrystal solution emitting light at 485 nm.

About 8 g of TOA, about 0.1 g of oleic acid, and about 0.4 mmol of zinc acetate are simultaneously introduced into a 125 ml flask mounted with a reflux condenser, and the reaction temperature is controlled to about 300° C. while agitating it. About 1 wt % of the synthesized CdSe nanocrystal solution is added into the reactant, and about 2 ml of 0.4 M S-TOP complex solution is slowly added thereto and reacted for about one hour to grow zinc-sulfide ("ZnS") nanocrystal on the CdSe nanocrystal surface and to provide a CdSe//ZnS alloy nanocrystal through diffusion at the interface.

After completing the reaction, the temperature of the reaction mixture is cooled to room temperature as quickly as possible, and a non-solvent of ethanol is added thereto and centrifugation is performed. The supernatant of the solution excluding the centrifuged precipitant is discarded, and the precipitant is dispersed in toluene to prepare a CdSe//ZnS alloy nanocrystal solution emitting light at 458 nm and having a size of about 5 nm.

About 8 g of TOA, about 0.1 g of oleic acid, about 0.05 mmol of cadmium oxide, and about 0.4 mmol of zinc acetate are simultaneously introduced into a 125 ml flask mounted with a reflux condenser, and the reaction temperature is controlled to about 300° C. while agitating it. About 1 wt % of the synthesized CdSe//ZnS nanocrystal solution is added into the reactant and about 2 ml of 0.4 M S-TOP complex solution is slowly added thereto and reacted for about one hour to grow the CdSZnS nanocrystal on the CdSe//ZnS nanocrystal surface and to provide a CdSe//ZnS/CdSZnS nanocrystal emitting light at about 535 nm.

After completing the reaction, the reaction mixture is cooled to room temperature as quickly as possible, and a non-solvent of ethanol is added thereto and centrifugation is performed. The supernatant of the solution excluding the centrifuged precipitant is discarded, and the precipitant is dispersed in toluene to prepare the CdSe//ZnS/CdSZnS nanocrystal solution. It is confirmed that the quantum efficiency of the nanocrystal is about 93%.

Comparative Example 1

Fabrication of Light Emitting Diode (LED) Device

The CdSe//ZnS/CdSZnS semiconductor nanocrystal emitting light at about 535 nm obtained from Preparation Example 1 is added with a solution in which hexane and ethanol are mixed at a volume ratio of about 6:4 and centrifuged at about 6000 revolutions per minute ("RPM") for about 10 minutes to provide a precipitant.

A chloroform solvent is added to the obtained precipitant to provide about 1 wt % of solution. Two commercially available silicones (OE6630A (a combination of a dimethylvinyl-siloxy-terminated methylphenyl siloxane, a silicone resin, and phenylmethyl siloxane) and OE6630B (a combination of a silsesquioxane and a polysiloxane) manufactured and sold by Dow Corning) are preliminarily mixed at a weight ratio of 1:4, and vapor in the commercial materials is removed. About 100 microliters ("µl") of prepared 1 wt % semiconductor nanocrystal solution in chloroform and about 0.5 g of the silicone mixture are mixed and uniformly agitated and maintained for about 1 hour under vacuum to remove the chloroform solution. About 10 µl of a silicone resin including no semiconductor nanocrystals is coated on the blue light emitting diode formed in a surface mount device ("SMD") shape and contacted and sealed with a glass plate having a thickness of about 0.2 mm to correspond to the size of an LED mold, and then about 5 µl of the mixture of silicones including the semiconductor nanocrystal is coated on the glass plate and cured at about 150° C. for about 2 hours to provide a light emitting diode device.

Example 1

Fabrication of Light Emitting Diode (LED) Device

OE6630A, and pentaerythritol tetrakis(3-mercaptopropionate) are mixed in a weight ratio of about 2:1 to provide a solution that is mixed with oxy-phenyl-acetic acid 2-[2-oxo-2-phenyl-acetoxy-ethoxy]-ethyl ester at about 1 wt %. The solution is coated on the cured silicone resin of the light emitting diode device according to Comparative Example 1 and UV cured for about 20 minutes to provide a first polymer layer.

Pentaerythritol tetrakis(3-mercaptopropionate) and 1,3,5-triallyl-1,3,5-triazine-2,4,6-trione are mixed at a mole ratio of about 3:4 and mixed with about 1 wt % of oxy-phenyl-acetic acid 2-[2-oxo-2-phenyl-acetoxy-ethoxy]-ethyl ester and coated on the first polymer layer. The contact angle of this second polymer layer coated on the first polymer layer is about 12 degrees. The coated mixture is UV cured for about 10 minutes to provide a light emitting diode device formed with the polymer film.

Example 2

Fabrication of Light Emitting Diode (LED) Device

A light emitting diode device formed with a polymer film is fabricated in accordance with the same procedure as in Example 1, except that the siloxane-containing oligomer of the first polymer layer is OE6630B. The contact angle of the second polymer layer coated on the first polymer layer is about 19 degrees.

Example 3

Fabrication of Light Emitting Diode (LED) Device

A light emitting diode device formed with a polymer film is fabricated in accordance with the same procedure as in Example 1, except that the siloxane-containing oligomer of the first polymer layer is obtained by mixing OE6630A and OE6630B at a weight ratio of about 1:4. The contact angle of the second polymer layer coated on the first polymer layer is about 19 degrees.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
| --- | --- |
| 116a: first polymer layer | 116b: second polymer layer |
| 112, 112a, 112b: matrix polymer | |
| 110: light emitting particle | 103: light emitting diode chip |
| 104: substrate | 114: transparent plate |
| 116: polymer film | 120: emission layer |

What is claimed is:

1. An optoelectronic device, comprising:
a light source;
an emission layer disposed on the light source comprising light emitting particles dispersed in a matrix polymer; and
a polymer film disposed on the emission layer,
wherein the light emitting particle comprises a semiconductor nanocrystal selected from a Group II-VI compound, a Group III-V compound, a Group IV-VI compound, a Group IV compound, or a combination thereof,
wherein the polymer film comprises a first polymer layer comprising a first polymer and a second polymer layer comprising a second polymer,
wherein the first polymer comprises a polymerized product of a first monomer comprising at least two thiol (—SH) groups and a siloxane-containing second monomer or oligomer comprising at least one carbon-carbon unsaturated bond at a terminal end,
wherein the second polymer comprises a polymerized product of a third monomer comprising at least two thiol (—SH) groups and a fourth monomer comprising at least two carbon-carbon unsaturated bonds at a terminal end, and
wherein the first polymer layer is disposed directly on the emission layer, and the second polymer layer is disposed directly on the first polymer layer.

2. The optoelectronic device of claim 1, wherein the first monomer and the third monomer comprising at least two thiol (—SH) groups are each independently represented by the following Chemical Formula 1:

Chemical Formula 1 wherein, in Chemical Formula 1,
$R^1$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group comprising a double bond or triple bond in a ring; a substituted or unsubstituted C3 to C30 heterocycloalkyl group comprising a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; $NH_2$; a substituted or unsubstituted C1 to C60 amine group (—NRR', wherein R and R' are each independently hydrogen or a linear or branched C1 to C30 alkyl group); an isocyanurate group; a (meth)acryloyloxy group; a halogen; —ROR' (wherein R is a substituted or unsubstituted C1 to C20 alkylene group and R' is hydrogen or a C1 to C20 alkyl group); —C(=O)OR' (wherein R' is hydrogen or a C1 to C20 alkyl group); —CN; or —C(=O)ONRR' (wherein R and R' are each independently hydrogen or a C1 to C20 alkyl group),
$L_1$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group,
$Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —N(R)— (wherein R is hydrogen or a linear or branched C1 to C10 alkyl group), or a combination thereof,
m is an integer of 1 or more,
k1 is an integer of 0 or 1 or more and k2 is an integer of 1 or more, and
the sum of m and k2 is an integer of 3 or more, provided that m does not exceed the valence of $Y_1$; and provided that the sum of $k_1$ and $k_2$ does not exceed the valence of $L_1$.

3. The optoelectronic device of claim 1, wherein the siloxane-containing second monomer or oligomer comprising at least one carbon-carbon unsaturated bond at a terminal end is represented by the following Chemical Formula 2:

Chemical Formula 2 wherein, in Chemical Formula 2,
$X^1$ to $X^3$ are each independently hydrogen, a substituted or unsubstituted C2 to C30 aliphatic organic group comprising a carbon-carbon unsaturated bond, a C6 to C30 aromatic organic group comprising a carbon-carbon unsaturated bond-containing substituent, or a substituted or unsubstituted C3 to C30 alicyclic organic group comprising a carbon-carbon unsaturated bond, or $X^1$ is a single bond to $X^2$ and $X^2$ is oxygen to provide a cyclic compound, provided that at least one of $X^1$ to $X^3$ comprises at least one carbon-carbon unsaturated bond, $R^1$ to $R^7$ are each independently hydrogen; a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group comprising a double bond or triple bond in a ring; a substituted or unsubstituted C3 to C30 heterocycloalkyl group comprising a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C60 amine group (—NRR', (wherein R and R' are each independently hydrogen or a linear or branched C1 to C30 alkyl group); an isocyanate group; an isocyanurate group; a (meth)acryloyloxy group; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), and n and m are each independently integers ranging from 0 to 300.

4. The optoelectronic device of claim 1, wherein the fourth monomer is represented by the following Chemical Formula 3:

Chemical Formula 3 wherein, in Chemical Formula 3,

X is a substituted or unsubstituted C2 to C30 aliphatic organic group comprising a carbon-carbon unsaturated bond, a C6 to C30 aromatic organic group comprising a carbon-carbon unsaturated bond-containing substituent, or a substituted or unsubstituted C3 to C30 alicyclic organic group comprising a carbon-carbon unsaturated bond, $R^2$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group comprising a double bond or triple bond in a ring; a substituted or unsubstituted C3 to C30 heterocycloalkyl group comprising a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; $NH_2$; a substituted or unsubstituted C1 to C60 amine group (—NRR', wherein R and R' are each independently hydrogen or a linear or branched C1 to C30 alkyl group); an isocyanate group; an isocyanurate group; a (meth)acryloyloxy group; a halogen; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), $L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group,

$Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof, n is an integer of 1 or more, k3 is an integer of 0 or 1 or more, k4 is an integer of 1 or more, and the sum of n and k4 is an integer of 3 or more, provided that n does not exceed the valence of $Y_2$; and provided that the sum of k3 and k4 does not exceed the valence of $L_2$.

5. The optoelectronic device of claim 2, wherein the first monomer and the third monomer of the above Chemical Formula 1 each independently comprises a monomer of the following Chemical Formula 1-1:

Chemical Formula 1-1 wherein, in Chemical Formula 1-1, $L_1'$ is a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 hetero cyclo alkylene group,

$Y_a$ to $Y_d$ are each independently a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), or —NR— (wherein R is hydrogen or a linear or branched C1 to C10 alkyl group), and $R_a$ to $R_d$ are a thiol group (—SH); or one or more of the groups $R_a$—$Y_a$—, $R_b$—$Y_b$—, $R_c$—$Y_c$—, and $R_d$—$Y_d$— are $R_1$ of Chemical Formula 1, provided that at least two of $R_a$ to $R_d$ are a thiol group (—SH).

6. The optoelectronic device of claim 4, wherein, in Chemical Formula 3, $L_2$ is a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

7. The optoelectronic device of claim 4, wherein the fourth monomer of the above Chemical Formula 3 comprises the compounds represented by the following Chemical Formulas 3-1 and 3-2:

Chemical Formula 3-1

Chemical Formula 3-2 wherein, in Chemical Formulas 3-1 and 3-2, $Z_1$ to $Z_3$ are each independently *—$Y_2$—$X_n$ of the above Chemical Formula 3, wherein * represents the point of attachment to $L_2$.

8. The optoelectronic device of claim 1, wherein the first polymer layer comprises a polymerized product of the first monomer and the second monomer, and the thiol groups of the first monomer and the unsaturated carbon-carbon bonds of the second monomer are present in a mole ratio of about 1:about 0.75 to about 1:about 1.25.

9. The optoelectronic device of claim 1, wherein the second polymer layer comprises a polymerized product of the third monomer and the fourth monomer, and the thiol groups of the third monomer and the unsaturated carbon-carbon bonds of the fourth monomer are present in a mole ratio of about 1:about 0.75 to about 1:about 1.25.

10. The optoelectronic device of claim 1, wherein the matrix polymer is a silicone resin.

11. The optoelectronic device of claim 10, wherein the silicone resin is a polymer that is obtained by curing a siloxane-containing monomer or oligomer that is the same as the second monomer or oligomer comprising at least one carbon-carbon unsaturated bond at a terminal end of the first polymer layer.

12. The optoelectronic device of claim 1, wherein the light emitting particle is pre-coated with a polymer comprising a carboxyl group or a salt thereof.

13. The optoelectronic device of claim 1, wherein the optoelectronic device further comprises a transparent plate between the light source and the emission layer.

14. The optoelectronic device of claim 1, wherein the first polymer and the second polymer are a polymerized product that is obtained by further polymerizing a fifth monomer comprising one thiol group located at a terminal end, a sixth monomer comprising one unsaturated carbon-carbon bond located at a terminal end of the sixth monomer, or a combination thereof.

15. A stacking structure, comprising:
a composite layer comprising a matrix polymer and a light emitting particle dispersed in the matrix polymer; and
a polymer film disposed on the composite layer,
wherein the light emitting particle comprises a semiconductor nanocrystal selected from a Group II-VI compound, a Group III-V compound, a Group IV-VI compound, a Group IV compound, or a combination thereof,
wherein the polymer film comprises a first polymer layer comprising a first polymer and a second polymer layer comprising a second polymer,
wherein the first polymer comprises a polymerized product of a first monomer comprising at least two thiol (—SH) groups and a siloxane-containing second monomer or oligomer comprising at least one carbon-carbon unsaturated bond at a terminal end,
wherein the second polymer comprises a polymerized product of a third monomer comprising at least two thiol (—SH) groups and a fourth monomer comprising at least two carbon-carbon unsaturated bonds at a terminal end, and
wherein the first polymer layer is disposed directly on the composite layer, and the second polymer layer is disposed directly on the first polymer layer.

16. The stacking structure of claim 15, wherein the first monomer and the third monomer comprising at least two thiol (—SH) groups are each independently represented by the following Chemical Formula 1:

Chemical Formula 1 wherein, in Chemical Formula 1,
$R^1$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group comprising a double bond or triple bond in a ring; a substituted or unsubstituted C3 to C30 heterocycloalkyl group comprising a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C60 amine group (—NRR', wherein R and R' are each independently hydrogen or a linear or branched C1 to C30 alkyl group); an isocyanurate group; (meth)acryloyloxy group; a halogen; —ROR' (wherein R is a substituted or unsubstituted C1 to C20 alkylene group and R' is hydrogen or a C1 to C20 alkyl group); —C(═O)OR' (wherein R' is hydrogen or a C1 to C20 alkyl group); —CN; or —C(═O)ONRR' (wherein R and R' are each independently hydrogen or a C1 to C20 alkyl group),
$L_1$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof, m is an integer of 1 or more, k1 is an integer of 0 or 1 or more, k2 is an integer of 1 or more, and the sum of m and k2 is an integer of 3 or more, provided that m does not exceed the valence of $Y_1$; and provided that the sum of $k_1$ and $k_2$ does not exceed the valence of $L_1$.

17. The stacking structure of claim 15, wherein the siloxane-containing second monomer or oligomer comprising at least one carbon-carbon unsaturated bond at a terminal end is represented by the following Chemical Formula 2:

Chemical Formula 2 wherein, in Chemical Formula 2, $X^1$ to $X^3$ are each independently hydrogen, a substituted or unsubstituted C2 to C30 aliphatic organic group comprising a carbon-carbon unsaturated bond, a C6 to C30 aromatic organic group comprising a carbon-carbon unsaturated bond-containing substituent, or a substituted or unsubstituted C3 to C30 alicyclic organic group comprising a carbon-carbon unsaturated bond, or $X^1$ is a single bond to $X^2$ and $X^2$ is oxygen to provide a cyclic compound, provided that at least one of $X^1$ to $X^3$ comprises at least one carbon-carbon unsaturated bond, $R^1$ to $R^7$ are each independently hydrogen; a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group comprising a double bond or triple bond in a ring; a substituted or unsubstituted C3 to C30 heterocycloalkyl group comprising a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; NH$_2$; a substituted or unsubstituted C1 to C60 amine group (—NRR', wherein R and R' are each independently hydrogen or a linear or branched C1 to C30 alkyl group); an isocyanate group; an isocyanurate group; a (meth)acryloyloxy group; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), and n and m are each independently integers ranging from 0 to 300.

18. The stacking structure of claim 15, wherein the fourth monomer is represented by the following Chemical Formula 3:

Chemical Formula 3 wherein, in Chemical Formula 3,

X is a substituted or unsubstituted C2 to C30 aliphatic organic group comprising a carbon-carbon unsaturated bond, a C6 to C30 aromatic organic group comprising a carbon-carbon unsaturated bond-containing substituent, or a substituted or unsubstituted C3 to C30 alicyclic organic group comprising a carbon-carbon unsaturated bond, $R^2$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group comprising a double bond or triple bond in a ring; a substituted or unsubstituted C3 to C30 heterocycloalkyl group comprising a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; NH$_2$; a substituted or unsubstituted C1 to C60 amine group (—NRR', wherein R and R' are each independently hydrogen or a linear or branched C1 to C30 alkyl group); an isocyanate group; an isocyanurate group; a (meth)acryloyloxy group; a halogen; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), $L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof, n is an integer of 1 or more, k3 is an integer of 0 or 1 or more, k4 is an integer of 1 or more, and the sum of n and k4 is an integer of 3 or more, provided that n does not exceed the valence of $Y_2$; and provided that the sum of k3 and k4 does not exceed the valence of $L_2$.

19. The stacking structure of claim 16, wherein the first monomer and the third monomer of the above Chemical Formula 1 each independently comprise a monomer of the following Chemical Formula 1-1:

Chemical Formula 1-1 wherein, in Chemical Formula 1-1, $L_1'$ is a substituted or unsubstituted C1 to C30 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 hetero cyclo alkylene group, $Y_a$ to $Y_d$ are each independently a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), or an imine group (—NR—) (wherein R is hydrogen or a linear or branched C1 to C10 alkyl group), and $R_a$ to $R_d$ are a thiol group (—SH); or one or more of the groups $R_a$—$Y_a$—, $R_b$—$Y_b$—, $R_c$—$Y_c$—, and $R_d$—$Y_d$— are $R_1$ of Chemical Formula 1, provided that at least two of $R_a$ to $R_d$ are a thiol group (—SH).

20. The stacking structure of claim 18, wherein, in Chemical Formula 3, $L_2$ is a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

* * * * *